United States Patent
Baker et al.

[11] Patent Number: 5,938,826
[45] Date of Patent: Aug. 17, 1999

[54] HOT MELT INK

[75] Inventors: Richard Baker, Keene; Ann Reitnauer, Dublin, both of N.H.

[73] Assignee: Markem Corporation, Keene, N.H.

[21] Appl. No.: 08/858,078

[22] Filed: May 16, 1997

[51] Int. Cl.$^6$ .................................................. C09D 11/12
[52] U.S. Cl. ................ 106/31.29; 106/31.3; 106/31.31; 106/31.61; 106/31.62; 106/31.63
[58] Field of Search ............... 106/31.29, 31.3, 106/31.31, 31.61, 31.62, 31.63

[56] References Cited

U.S. PATENT DOCUMENTS

| | | | |
|---|---|---|---|
| 4,256,493 | 3/1981 | Yokoyama et al. | 106/31.27 |
| 4,336,067 | 6/1982 | Shackle et al. | 106/31.16 |
| 4,337,289 | 6/1982 | Reed et al. | 428/195 |
| 4,426,227 | 1/1984 | Keeling et al. | 106/31.29 |
| 4,472,537 | 9/1984 | Johnson et al. | 523/160 |
| 4,659,383 | 4/1987 | Lin et al. | 106/31.29 |
| 4,812,354 | 3/1989 | Sugiyama et al. | 428/195 |
| 4,851,045 | 7/1989 | Tangiguchi | 106/31.31 |
| 5,000,786 | 3/1991 | Matsuzaki | 106/31.29 |
| 5,006,170 | 4/1991 | Schwarz et al. | 106/31.29 |
| 5,053,079 | 10/1991 | Haxell et al. | 106/31.63 |
| 5,084,099 | 1/1992 | Jaeger et al. | 106/31.29 |
| 5,096,781 | 3/1992 | Vieira et al. | 428/411.1 |
| 5,122,187 | 6/1992 | Schwarz et al. | 106/31.29 |
| 5,156,089 | 10/1992 | McCue et al. | 101/128.4 |
| 5,190,582 | 3/1993 | Shinozuka et al. | 106/31.29 |
| 5,230,731 | 7/1993 | Kanbayashi et al. | 106/31.29 |
| 5,259,873 | 11/1993 | Fujoika | 106/31.29 |
| 5,270,078 | 12/1993 | Walker et al. | 427/264 |
| 5,286,288 | 2/1994 | Tobias et al. | 106/31.29 |
| 5,292,556 | 3/1994 | Ma et al. | 427/264 |
| 5,298,062 | 3/1994 | Davies et al. | 106/31.29 |
| 5,350,446 | 9/1994 | Lin et al. | 106/31.29 |
| 5,354,368 | 10/1994 | Larson, Jr. | 106/31.29 |
| 5,385,957 | 1/1995 | Tobias et al. | 523/161 |
| 5,389,132 | 2/1995 | Davulcu et al. | 106/31.58 |
| 5,397,388 | 3/1995 | Fukioka | 106/31.29 |
| 5,409,530 | 4/1995 | Kanbayashi et al. | 106/31.29 |
| 5,421,868 | 6/1995 | Ayalia-Esquilin et al. | 106/31.29 |
| 5,445,916 | 8/1995 | Curtis | 430/270 |
| 5,466,653 | 11/1995 | Ma et al. | 503/200 |
| 5,495,803 | 3/1996 | Gerber et al. | 101/401.1 |
| 5,507,864 | 4/1996 | Jaeger et al. | 106/31.29 |
| 5,511,477 | 4/1996 | Adler et al. | 101/401.1 |
| 5,779,779 | 7/1998 | Jolly | 106/31.29 |

FOREIGN PATENT DOCUMENTS

| | | |
|---|---|---|
| 562860-A1 | 9/1993 | European Pat. Off. . |
| 3239026 | 5/1983 | Germany . |
| 75005088 | 2/1975 | Japan . |
| 50-033004 | 3/1975 | Japan . |
| 53-140105 | 12/1978 | Japan . |
| 57-074193 | 5/1982 | Japan . |
| 59-053566 | 3/1984 | Japan . |
| 62-068810 | 3/1987 | Japan . |
| 62-106971 | 5/1987 | Japan . |
| 03168209 | 7/1991 | Japan . |
| 04117469 | 4/1992 | Japan . |
| 05138863 | 6/1993 | Japan . |
| 06208223 | 7/1994 | Japan . |
| 06248198 | 9/1994 | Japan . |
| 06256418 | 9/1994 | Japan . |
| 07207208 | 8/1995 | Japan . |
| 08003275 | 1/1996 | Japan . |
| WO9303103 A1 | 2/1993 | WIPO . |

*Primary Examiner*—Helene Klemanski
*Attorney, Agent, or Firm*—Fish & Richardson P.C.

[57] ABSTRACT

A hot melt ink having a water auto-dispersibility of at least 50%, methods for using this ink to provide marks having a water auto-dispersibility of at least 50%, and methods for using this ink to provide UV opaque masks are disclosed.

31 Claims, 1 Drawing Sheet

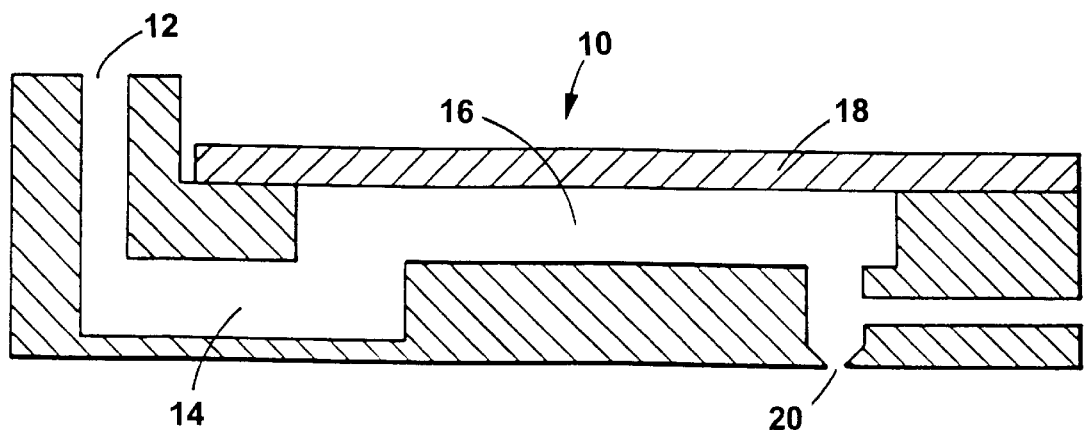
FIGURE

HOT MELT INK

BACKGROUND OF THE INVENTION

The invention relates to hot melt inks.

Hot melt inks are solid at room temperature and liquid at temperatures above room temperature. Hot melt inks can be used, for example, in ink jet printing. During ink jet printing, the ink is heated so that it becomes liquid, then is ejected through a printhead onto a substrate. The ink then solidifies on the substrate.

Hot melt inks have been used in a variety of applications, including printing screen manufacturing processes. During such processes, a printing screen is coated with a layer of ultraviolet (UV) curable material; a hot melt ink is then applied to parts of the UV curable layer. The screen is then exposed to UV light. The hot melt ink provides a UV opaque "mask" that prevents the material covered by the mask from being cured by the UV light.

At the end of the manufacturing process, the uncured material, as well as the ink mask, are removed by washing the screen with water. Often, extended washing processes are required. In addition, the ink typically falls off the screen in large clumps or flakes during the washing processes. These large pieces can lead to problems because they can redeposit on the screen and can clog the filters of the equipment used to perform the washing procedure.

SUMMARY OF THE INVENTION

In general, the invention features hot melt inks having a water auto-dispersibility of at least 50%. Because the inks have the property of water auto-dispersibility, they can be easily removed from a variety of substrates, for example, by immersing the substrates in water. When immersed in water, the inks quickly form solutions or suspensions of small particles, rather than large clumps. The inks are therefore easy to remove and have a reduced tendency to clog the filters of washing equipment.

The preferred inks include components, such as waxes and resins, that have water auto-dispersibilities of at least 50%. The inks may also include a colorant that renders the inks opaque to UV light.

The invention further features a method for forming a mark on a substrate. The method includes heating a hot melt ink having a water auto-dispersibility of at least 50% to a temperature sufficient to liquify the ink and transferring the ink to a substrate to provide a mark on the substrate. The mark may have a water auto-dispersibility of at least 50% as well.

The invention also features a composition that includes a substrate, a layer of a UV curable substance on the substrate, and a layer of a UV opaque hot melt ink having a water auto-dispersibility of at least 50% on part of the UV curable substance layer. The UV opaque ink provides masked and unmasked portions of the UV curable substance layer.

The invention further features a method for forming a printing screen. The method includes applying a layer of a UV curable substance to a substrate; heating a UV opaque hot melt ink having a water auto-dispersibility of at least 50% to a temperature sufficient to liquify the ink; transferring the ink to the UV curable substance layer to provide a UV opaque mask that provides masked and unmasked portions of the UV curable substance layer; exposing the UV curable substance layer to UV light to cure the unmasked portions of the UV curable substance layer; and washing the substrate with water to remove the masked portions of the UV curable substance layer and the UV opaque mask.

The inks have a water auto-dispersibility of at least 50%. Water auto-dispersibility, as used herein in referring to a material (e.g., an ink or a component of the ink), is tested according to the following procedure. A 75 µm thick draw down of the material on a 25 mm by 75 mm glass support is immersed in deionized water at 25° C. for one minute without agitation. The support is then removed from the water and observed. The water auto-dispersibility of the material is the percentage of the draw down that is (a) dissolved in the water and/or (b) dispersed into particles smaller than 100 µm, which can be settled at the bottom or top of the water bath, dispersed throughout the water bath, or in contact with the glass support. Preferred inks and components of the inks have a water auto-dispersibility of at least 70%, more preferably at least 80%. Some materials may have a water auto-dispersibility of as high as at least 90%, or at least 95%.

The inks described above can be used to make marks or masks on substrates. The water auto-dispersibility of the marks/masks is tested according to a similar procedure. The substrate on which the mark/mask has been made is immersed in deionized water at 25° C. for one minute without agitation, then removed from the water bath. The water auto-dispersibility of the mark/mask is the percentage of the material used to form the mark/mask that is dissolved (according to (a)) and/or dispersed (according to (b)). Preferred marks/masks have a water auto-dispersibility of at least 70%, and more preferably, at least 80%. Marks/masks may have a water auto-dispersibility of as high as at least 90%, or at least 95%.

The term "non-dispersible," as used herein, means that a material has a water auto-dispersibility of less than 50%.

The term "masked," as used herein, means that a material is covered by a mask formed from a UV opaque hot melt ink having a water auto-dispersibility of at least 50%.

The term "unmasked," as used herein, means that a material is not covered by a mask formed from a UV opaque hot melt ink having a water auto-dispersibility of at least 50%.

The term "melt viscosity," as used herein, means the viscosity of an ink in its liquid state at a temperature between about 50° C. and about 150° C.

Other features and advantages of the invention will be apparent from the description of the preferred embodiments thereof, and from the claims.

BRIEF DESCRIPTION OF THE DRAWING

The FIGURE is a sectional view of an ink jet printhead.

DESCRIPTION OF THE PREFERRED EMBODIMENTS

A preferred ink has a water auto-dispersibility of at least 50% and includes a wax and/or a resin that have/has a water auto-dispersibility of at least 50%, a colorant that may render the ink UV opaque, and a stabilizer. The inks, waxes, and resins may also have water auto-dispersibilities of at least 70%, at least 80%, at least 90%, or at least 95%.

The wax and/or resin component having a water auto-dispersibility of at least 50% helps provide the ink with a water auto-dispersibility of at least 50%. Preferred inks include about 5% to about 100%, more preferably about 25% to about 85%, by weight of the wax and/or resin.

Examples of waxes having a water auto-dispersibility of at least 50% include polyethylene glycol, methoxylated polyethylene glycol (e.g., methoxylated polyethylene glycol available from Union Carbide under the trade name CAR-BOWAX 2000) and ethoxylated polyethylene (e.g., ethoxylated polyethylene available from Petrolite under the trade name UNITHOX Grade 480).

Examples of resins having a water auto-dispersibility of at least 50% include branched polyesters, dextrin, and cellulose gum. A preferred resin is a branched polyester, available from Eastman Kodak under the trade name AQ 1045.

The ink may include a non-dispersible wax. The non-dispersible wax provides the ink with the targeted viscosity. Preferred inks have a melt viscosity of about 5 to about 100 centipoise. The non-dispersible wax also provides the ink with the desired melting point, which is generally lower than the temperature at which the ink jet printer operates. Preferably, the ink does not contain enough of the non-dispersible wax to render the ink non-dispersible. Preferred inks include less than about 95%, more preferably less than about 80%, by weight non-dispersible wax.

Examples of non-dispersible waxes include stearic acid, lauric acid, linear polyethylene, behenic acid, stearone, carnauba waxes, microcrystalline waxes, paraffin waxes, polyethylene waxes, candelilla waxes, montan waxes, Fischer-Tropsch waxes, bisamide waxes, amide waxes, hydrogenated castor oil, synthetic ester waxes, oxidized polyethylene waxes, oleamides, stearamides, lauramides, erucamides, glycerol esters, chlorinated waxes, urethane modified waxes, and other synthetic and natural waxes. A preferred non-dispersible wax is montan ester wax, available from Hoechst under the designation Wax E.

Alternatively, the ink may include a non-dispersible resin. The non-dispersible resin provides the ink with the targeted viscosity. Preferably, the ink does not contain enough of the non-dispersible resin to render the ink non-dispersible. Preferred inks include less than about 95%, more preferably less than about 80%, by weight non-dispersible resin.

Examples of non-dispersible resins include glycerol esters, pentaerythritol esters, hydrocarbons, rosin, rosin esters, modified rosin esters (e.g., hydrogenated, acid, or phenolic-modified rosin esters), cumarone/indene copolymers, cyclic ketone polymers, styrene/allyl alcohol copolymers, polystyrenes, polyvinyl toluene/methylstyrene copolymers, polyvinyl chloride, polyvinyl alcohol, ethylene/vinyl acetate, ethylene/acrylic acid, alkyl hydrocarbon polymers, aryl hydrocarbon polymers, alkyl aryl hydrocarbon polymers, terpene polymers, ethylene/carbon monoxide copolymers, vinyl chloride/vinyl alcohol copolymers, polyvinyl butyral, polyketones, styrene/acrylic copolymers, polybutenes, polybutadienes, styrene/isoprene/styrene block copolymers, styrene/butadiene/styrene block copolymers, polyvinyl pyrrolidone, polyvinyl pyridine, vinyl pyrrolidone/vinyl acetate, polyurethanes, polyesters, polyamides, styrene-acrylates, polypropylene, chlorinated polypropylene, chlorinated paraffin, gilsonite and other asphaltic materials, cyclic hydrocarbon polymers, halogenated polymers, acrylics, epoxides, novolacs, and other synthetic and natural resins. A preferred non-dispersible resin is polystyrene, available from Hercules under the trade name Piccolastic.

The colorant provides color to the ink and/or renders the ink substantially opaque to UV light. The ink preferably includes a sufficient quantity of colorant so that the ink has adequate color and/or is substantially opaque to UV light. Preferred inks include less than about 10%, more preferably from about 3% to about 6%, by weight of the colorant. Examples of colorants include anthraquinone and perinone reds such as solvent red 172, solvent red 111, solvent red 222, solvent red 207, and solvent red 135; anthraquinone blues such as solvent blue 104 and solvent violet 13; anthraquinone greens such as solvent green 3 and solvent green 5; xanthane, quinoline, quinophthalone, pyrazolone, methine, and anthraquinoid yellows such as solvent yellow 98, solvent yellow 33, disperse yellow 54, solvent yellow 93, disperse yellow 82, and solvent yellow 163. A preferred colorant is Sudan Yellow 146, available from BASF.

The stabilizer inhibits oxidation of the ink components. Sufficient stabilizer should be included to inhibit oxidation, but not so much should be included that the other properties of the ink are adversely affected. The ink preferably includes less than about 2%, more preferably from about 0.3% to about 0.8%, of the stabilizer by weight. Suitable stabilizers include antioxidants and heat stabilizers such as hindered phenols, organophosphites, phosphited phenols, phosphited bisphenols, bisphenols, and alkylated phenolics. A preferred stabilizer is terakis[methylene (3,5-di-t-butyl-4-hydroxylhydrocinnamate)]methane, available from Ciba Geigy under the trade name IRGANOX 1010.

Additionally, the ink may include other conventional hot melt ink ingredients such as flexibilizers and/or plasticizers. Examples of flexibilizers/plasticizers include aromatic sulfonamides, phthalates, acetates, adipates, amides, azelates, epoxides, glutarates, laurates, oleates, sebacates, stearates, sulfonates, tallates, phosphates, benzoin ethers, and trimelletates. A sufficient quantity of these optional ingredients may be included in the ink to provide the desired property.

The inks generally are prepared by combining the waxes and/or the resins with any optional ingredients, heating the combination to its melting point, and slowly stirring until the liquified combination is homogeneous. If a colorant is to be included, it is then added to the mixture with stirring. The molten ink is then filtered to remove particles larger than 1 $\mu$m in size.

EXAMPLE 1

A hot melt ink having a water auto-dispersibility of 100% was prepared that included 80.60 weight % CARBOWAX 2000 (MPEG) (available from Union Carbide), 14.93 weight % Piccolastic A75 (available from Hercules), 0.50 weight % IRGANOX 1010 (available from Ciba Geigy), and 3.98 weight % Sudan Yellow 146 (available from BASF).

The ink was subjected to the test for water auto-dispersibility described above. A draw down of the ink on a glass support was immersed in deionized water. Within one minute, 100% of the ink dispersed into particles smaller than 100 $\mu$m; the particles remained in loose contact with the glass support.

EXAMPLE 2

A hot melt ink having a water auto-dispersibility of 100% was prepared that included 63.35 weight % Wax E Flaked (available from Hoechst), 31.72 weight % UNITHOX Grade 480 (available from Petrolite), 0.49 weight % IRGANOX 1010 (available from Ciba Geigy), and 4.43 weight % Sudan Yellow 146 (available from BASF).

The ink was subjected to the test for water auto-dispersibility described above. A draw down of the ink on a glass support was immersed in deionized water. Within one minute, 100% of the ink dispersed into particles smaller than 100 $\mu$m. A portion of the particles remained in loose contact with the glass support.

The preferred inks can be used with a conventional hot melt ink jet printer, such as a Markem 962 printer. Referring to the FIGURE, the printhead 10 of this printer includes a fill port 12, a membrane cavity 14, a pumping chamber 16, a PZT (piezoelectric transducer) 18, and an orifice 20. The ink is placed in the printhead through the fill port 12; the ink then passes through the membrane cavity 14, where is it degassed. The ink then flows into the pumping chamber 16. The printhead 10 is heated, so that the ink is melted to a liquid state prior to being ejected from the ink jet printhead. The liquid ink is ejected by activation of the PZT (piezoelectric transducer) 18. As a substrate passes by the orifice 20, droplets of the hot, liquid ink are ejected through the orifice. Upon contacting the substrate, which is typically at room temperature, the liquid ink cools and solidifies.

Alternatively, the inks can be transferred to substrates using heated ink roll methods, hot stamp methods, or thermal transfer methods, as known in the art.

A mark can be printed on a substrate using the hot melt ink having a water auto-dispersibility of at least 50% described above and one of the methods described above; the mark itself may have a water auto-dispersibility of at least 50%. Such marks may be printed on substrates such as metals, plastics, fabrics, and food products (e.g., vegetables, fruits, and confectioneries). The mark can later be washed off the substrate, for example, by submerging the substrate in a water bath or spraying the substrate with a stream of water. In the case of confectioneries, the mark can be removed as the confectionery is consumed.

A hot melt ink having a water auto-dispersibility of at least 50% and containing a colorant that renders the ink UV opaque can be used to form a UV opaque mask having a water auto-dispersibility of at least 50% on a substrate. For example, a layer of a UV curable material, such as a photoemulsion, can be applied to a screen mesh made of a material such as nickel, stainless steel, nylon, or polyester. The UV opaque ink having a water auto-dispersibility of at least 50% can then be applied to the substrate in a desired pattern using one of the methods described above. The layer of UV opaque ink provides masked portions of the photoemulsion layer and unmasked portions of the photoemulsion layer.

Compositions containing masked and unmasked portions of a photoemulsion layer are useful in a variety of applications, such as in printing screen manufacturing processes. During such processes, a printing screen made of a material such as nickel, stainless steel, nylon, or polyester is releasably secured to a support. A UV curable material, such as a photoemulsion, is then applied to the surface of the screen. The photoemulsion layer may be applied as a liquid that is later allowed to dry and harden, or as a sheet material.

A hot melt ink having a water auto-dispersibility of at least 50% is then applied to the photoemulsion in a desired pattern, using the ink jet printing method described above. The ink provides a UV opaque "mask" that prevents the masked photoemulsion from being cured by UV light.

The screen is then exposed to a suitable UV light source, causing the unmasked portions of the photoemulsion to cure. The cured regions of the photoemulsion become hardened and affixed to the screen.

After exposure to the UV light, the uncured (and thus un-hardened) photoemulsion, as well as the ink mask, are removed from the screen by spraying the screen with water and gently brushing the screen. A pattern of raised areas of hardened emulsion corresponding to the negative image of the ink mask remains on the substrate. The cured emulsion is then post baked to complete the curing process, resulting in a screen suitable for industrial printing.

Since the preferred inks have a water auto-dispersibility of at least 50%, they are relatively easy to remove from the screens with a single water washing cycle, instead of requiring extended washing cycles and/or soaking periods. The preferred inks are converted to a solution or a suspension of small particles when exposed to water and therefore do not prematurely clog the filters of the equipment used to perform the washing procedure.

Masks made from the preferred inks can be removed from the screens with a single washing cycle, even when thin photoemulsion layers (which allow for greater printing resolution) are used.

Other embodiments are within the claims.

What is claimed is:

1. A hot melt ink having a water auto-dispersibility of at least 50% said ink comprising a wax.

2. The ink of claim 1, wherein said ink has a water auto-dispersibility of at least 70%.

3. The ink of claim 1, wherein said ink has a water auto-dispersibility of at least 80%.

4. The ink of claim 1, wherein said ink has a water auto-dispersibility of at least 90%.

5. The ink of claim 1, wherein said ink has a water auto-dispersibility of at least 95%.

6. The ink of claim 1, wherein said ink comprises a wax having a water auto-dispersibility of at least 50%.

7. The ink of claim 6, wherein said wax comprises polyethylene glycol.

8. The ink of claim 6, wherein said wax comprises methoxylated polyethylene glycol.

9. The ink of claim 6, wherein said wax comprises ethoxylated polyethylene.

10. The ink of claim 6, wherein said ink further comprises a non-dispersible wax.

11. The ink of claim 10, wherein said non-dispersible wax is selected from the group consisting of stearic acid, lauric acid, linear polyethylene, behenic acid, stearone, carnauba waxes, microcrystalline waxes, paraffin waxes, polyethylene waxes, candelilla waxes, montan waxes, Fischer-Tropsch waxes, bisamide waxes, amide waxes, hydrogenated castor oil, synthetic ester waxes, oxidized polyethylene waxes, oleamides, stearamides, lauramides, erucamides, glycerol esters, chlorinated waxes, and urethane modified waxes.

12. The ink of claim 6, wherein said ink further comprises a resin having a water auto-dispersibility of at least 50%.

13. The ink of claim 12, wherein said resin comprises a branched polyester.

14. The ink of claim 12, wherein said resin comprises dextrin.

15. The ink of claim 12, wherein said resin comprises cellulose gum.

16. The ink of claim 6, wherein said ink further comprises a non-dispersible resin.

17. The ink of claim 16, wherein said non-dispersible resin is selected from the group consisting of glycerol esters, pentaerythritol esters, hydrocarbons, rosin, rosin esters, modified rosin esters, cumarone/indene copolymers, cyclic ketone polymers, styrene/allyl alcohol copolymers, polystyrenes, polyvinyl toluene/methylstyrene copolymers, polyvinyl chloride, polyvinyl alcohol, ethylene/vinyl acetate, ethylene/acrylic acid, alkyl hydrocarbon polymers, aryl hydrocarbon polymers, alkyl aryl hydrocarbon polymers, terpene polymers, ethylene/carbon monoxide copolymers, vinyl chloride/vinyl alcohol copolymers, polyvinyl butyral, polyketones, styrene/acrylic copolymers, polybutenes, polybutadienes, styrene/isoprene/styrene block copolymers, styrene/butadiene/styrene block copolymers, polyvinyl pyrrolidone, polyvinyl pyridine, vinyl pyrrolidone/vinyl acetate, polyurethanes, polyesters, polyamides, styreneacrylates, polypropylene, chlorinated polypropylene, chlorinated paraffin, gilsonite, cyclic hydrocarbon polymers, halogenated polymers, acrylics, epoxides, and novolacs.

18. The ink of claim 16, wherein said non-dispersible resin comprises polystyrene.

19. The ink of claim 1, wherein said ink comprises a resin having a water auto-dispersibility of at least 50%.

20. The ink of claim 19, wherein said ink further comprises a non-dispersible wax.

21. The ink of claim 1, wherein said ink comprises a colorant.

22. The ink of claim 21, wherein said ink is UV opaque.

23. The ink of claim 1, wherein said ink has a melt viscosity of about 5 to about 100 centipoise.

24. A hot melt ink having a water auto-dispersibility of at least 50%, comprising a resin having a water auto-dispersibility of at least 50%, a non-dispersible wax, a colorant, and a stabilizer.

25. A hot melt ink having a water auto-dispersibility of at least 50%, comprising a wax having a water auto-dispersibility of at least 50%, a non-dispersible wax, a colorant, and a stabilizer.

26. A hot melt ink having a water auto-dispersibility of at least 50%, comprising a wax having a water auto-dispersibility of at least 50%, a non-dispersible resin, a colorant, and a stabilizer.

27. A method for forming a mark on a substrate, said method comprising (a) heating a hot melt ink having a water auto-dispersibility of at least 50% to a temperature sufficient to liquify said ink; and (b) transferring said ink to a substrate to provide a mark on said substrate.

28. The method of claim 27, wherein said mark has a water auto-dispersibility of at least 50%.

29. The method of claim 28, wherein said substrate is selected from the group consisting of metals, plastics, fabrics, and food products.

30. A composition comprising (a) a substrate;

(b) a layer of a UV curable substance on said substrate; and (c) a layer of a UV opaque hot melt ink having a water auto-dispersibility of at least 50% on part of said UV curable substance layer, to provide masked and unmasked portions of said UV curable substance layer.

31. A method for forming a printing screen, said method comprising (a) applying a layer of a UV curable substance to a substrate;

(b) heating a UV opaque hot melt ink having a water auto-dispersibility of at least 50% to a temperature sufficient to liquify said ink;

(c) transferring said ink to said UV curable substance layer to provide a UV opaque mask having a water auto-dispersibility of at least 50%, to provide masked portions and unmasked portions of said UV curable substance layer;

(d) exposing the UV curable substance layer to UV light, to cure the unmasked portions of said UV curable substance layer; and (e) washing said substrate with water to remove said masked portions of said UV curable substance layer and said UV opaque mask.

* * * * *